(12) United States Patent
Peng et al.

(10) Patent No.: US 10,068,694 B2
(45) Date of Patent: Sep. 4, 2018

(54) INTEGRATED CIRCUITS AND COUPLED INDUCTORS WITH ISOTROPIC MAGNETIC CORES, AND METHODS FOR FABRICATING THE SAME

(71) Applicant: Globalfoundries Singapore Pte. Ltd., Singapore (SG)

(72) Inventors: Lulu Peng, Singapore (SG); Donald Ray Disney, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/920,961

(22) Filed: Mar. 14, 2018

(65) Prior Publication Data

US 2018/0204665 A1    Jul. 19, 2018

Related U.S. Application Data

(62) Division of application No. 15/394,212, filed on Dec. 29, 2016, now Pat. No. 9,966,186.

(51) Int. Cl.
| | |
|---|---|
| *H03K 17/78* | (2006.01) |
| *H01F 27/28* | (2006.01) |
| *H01L 23/498* | (2006.01) |
| *H01F 27/24* | (2006.01) |
| *H01F 1/147* | (2006.01) |

(52) U.S. Cl.
CPC ..... *H01F 27/2804* (2013.01); *H01F 1/14708* (2013.01); *H01F 27/24* (2013.01); *H01L 23/498* (2013.01)

(58) Field of Classification Search
CPC .............. H01L 23/498; H01F 1/14708; H01F 27/2804; H01F 27/24
USPC .......................................... 327/524
See application file for complete search history.

(56) References Cited

U.S. PATENT DOCUMENTS

| | | |
|---|---|---|
| 4,901,048 A | 2/1990 | Williamson |
| 2011/0316612 A1 | 12/2011 | de Rochemont |
| 2017/0148560 A1 | 5/2017 | Yoon et al. |

*Primary Examiner* — David S Blum
(74) *Attorney, Agent, or Firm* — Lorenz & Kopf, LLP (57) ABSTRACT

Integrated circuits and coupled inductors with isotropic magnetic cores, and methods for fabricating integrated circuits and coupled inductors with isotropic magnetic cores are provided. In an embodiment, a method for fabricating an integrated circuit is provided. The method includes providing a semiconductor substrate and forming an isotropic magnetic core bottom yoke over the semiconductor substrate. Further, the method includes forming an inductor coil over the isotropic magnetic core bottom yoke. Also, the method includes forming isotropic magnetic core sidewalls over the isotropic magnetic core bottom yoke and around the inductor coil. The method includes forming an isotropic magnetic core top yoke over the isotropic magnetic core sidewalls and over the inductor coil.

20 Claims, 7 Drawing Sheets

INTEGRATED CIRCUITS AND COUPLED INDUCTORS WITH ISOTROPIC MAGNETIC CORES, AND METHODS FOR FABRICATING THE SAME

CROSS-REFERENCE TO RELATED APPLICATION

This application claims priority to U.S. patent application Ser. No. 15/394,212, now U.S. Pat. No. 9,966,186, filed Dec. 29, 2016, which is incorporated herein by reference in its entirety.

TECHNICAL FIELD

The technical field generally relates to integrated circuits, and more particularly relates to on-chip coupled inductors with magnetic cores for integrated switch-inductor power conversion.

BACKGROUND

In existing microelectronic devices, such as mobile telecommunication devices, on-chip magnetics are not currently feasible. Further, off-chip magnetics, such as inductors and transformers, in power circuits are typically bulky and expensive.

The constant drive to reduce the physical size of various consumer electronic products that employ integrated circuits has resulted in the scaling or reduction in the physical size of integrated circuit devices that are employed in such consumer products. The reduction in size of the integrated circuit devices has allowed for an increase in switching frequency and a reduction in required inductance value to a few hundred nano Henry (nH). Therefore, the use of on-chip inductors may become possible.

The primary obstacle facing development of on-chip inductors for use in integrated voltage regulators is the integration of suitable power inductors that can carry high current levels within a constrained area. Prior designs suffer from large DC resistance, large DC/AC power loss, and low efficiency or small current capability (such as less than 0.5 A).

Accordingly, it is desirable to provide improved coupled inductors, such as for use in voltage regulators. Further, it is desirable to provide a method for fabricating an integrated circuit including a coupled inductor that is cost effective and time efficient. Furthermore, other desirable features and characteristics will become apparent from the subsequent detailed description and the appended claims, taken in conjunction with the accompanying drawings and this background.

BRIEF SUMMARY

Integrated circuits and coupled inductors with isotropic magnetic cores, and methods for fabricating integrated circuits and coupled inductors with isotropic magnetic cores are provided. In an exemplary embodiment, a method for fabricating an integrated circuit is provided. The method includes providing a semiconductor substrate and forming an isotropic magnetic core bottom yoke over the semiconductor substrate. Further, the method includes forming an inductor coil over the isotropic magnetic core bottom yoke. Also, the method includes forming isotropic magnetic core sidewalls over the isotropic magnetic core bottom yoke and around the inductor coil. The method includes forming an isotropic magnetic core top yoke over the isotropic magnetic core sidewalls and over the inductor coil.

In another exemplary embodiment, a method for fabricating an integrated circuit includes providing a semiconductor substrate. The method includes forming a voltage regulator in an interposer. The voltage regulator includes a coupled inductor including an interleaved inductor coil arranged around a coil center and an isotropic magnetic core surrounding a portion of the interleaved inductor coil and passing through the coil center. The interposer is physically coupled to the semiconductor substrate. The method further includes physically coupling an integrated circuit device to the interposer. The voltage regulator is operable for regulating an operating voltage of the integrated circuit device.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuits and coupled inductors with isotropic magnetic cores, or methods for fabricating integrated circuits and coupled inductors with isotropic magnetic cores. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "top", "bottom", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, an exemplary integrated circuit includes an on-chip two-phase symmetrically coupled inductor with an isotropic magnetic core. In an exemplary embodiment, the inductor includes two inductor coils that are interleaved with one another. Further, the exemplary inductor coils are structurally identical. Also, the exemplary inductor includes an isotropic magnetic core. In an exemplary embodiment, the isotropic magnetic core surrounds a portion of the interleaved inductor coils. The exemplary coupled inductor exhibits high inductance, large current capability, and small DC resistance. Further, the exemplary coupled inductor requires less chip area than known inductors.

Figure 1:
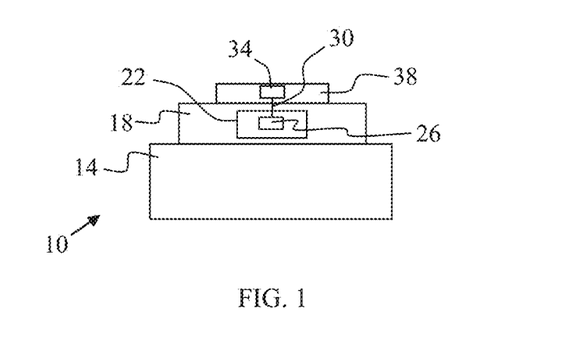
FIG. 1 is a schematic illustrating an integrated circuit structure including a voltage regulator with a coupled inductor in accordance with an embodiment herein.

In FIG. 1, an integrated circuit 10 is provided. The exemplary integrated circuit 10 provides integrated voltage regulation for power conversion. As shown, the integrated circuit 10 includes a semiconductor substrate 14. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 25 weight percent based on the total weight of the material unless otherwise indicated.

Various microelectronic circuitry may be formed on and within the semiconductor substrate 14 according to conventional processing. As shown, an interposer 18 is coupled to and supported by the semiconductor substrate 14. An exemplary interposer 18 includes silicon though other suitable materials may be used. An exemplary interposer 18 is an intervening device that is generally employed to connect a device with a high density of contacts to an upper level device that has a lower density of contacts. Interposers generally include a semiconductor substrate with metal lines and electrically-conductive vias passing therethrough to enable electrical connection on both sides thereof. Due to the precision that would be required to directly connect to the lower device with the high density of contacts, the interposer makes electrical connection easier and requires less precision.

The integrated circuit 10 further includes a voltage regulator 22 integrated with the interposer 18. The voltage regulator 22 includes coupled inductors 26 as described in the following figures. As shown, the voltage regulator 22 is coupled to one or more vertical interconnect accesses (vias) 30 formed in the interposer 18.

As shown, a CMOS integrated circuit device 34 is formed in and on a semiconductor layer or substrate 38. An exemplary integrated circuit device 34 is a converter, such as a buck converter. Semiconductor layer 38 may be silicon or another suitable semiconductor material as described above. In an exemplary embodiment, the semiconductor layer 38 is physically coupled to and supported by the interposer 18. Further, in the exemplary embodiment, the integrated circuit device 34 includes a contact that is aligned with and disposed on or near the one or more vias 30 to electrically couple the voltage regulator 22 of the interposer 18 to the integrated circuit device 34. An exemplary voltage regulator 22 is operable for regulating an operating voltage of the integrated circuit device 34.

Figure 2:
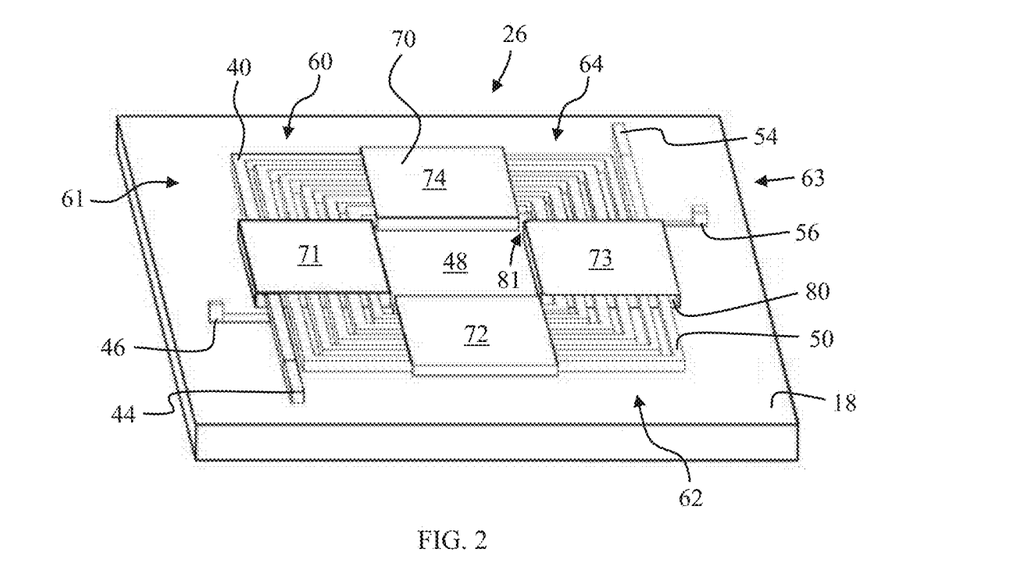
FIG. 2 is a perspective view of a rectangular coupled inductor, in accordance with an embodiment herein.

Referring to FIG. 2, an exemplary coupled inductor 26, formed in an interposer 18 and used in the integrated circuit 10 of FIG. 1, is illustrated in more detail. As shown, the coupled inductor 26 includes a first conductive inductor coil 40 that extends between and is electrically connected to a first terminal 44 to a second terminal 46. The exemplary first inductor coil 40 of FIG. 2 is a winding centered on and arranged around a coil center 48. As shown, the coupled inductor 26 includes a second conductive inductor coil 50 that extends between and is electrically connected to a first terminal 54 to a second terminal 56. The exemplary second inductor coil 50 of FIG. 2 is a winding centered on the coil center 48. In the embodiment of FIG. 2, the coupled inductor 26 is formed with a square rectangular layout shape. The coil center 48 may be considered to be the region bounded by the innermost winding of the coupled inductor 26.

As shown, the first inductor coil 40 and second inductor coil 50 are structurally identical. Further, the first inductor coil 40 and second inductor coil 50 are interleaved such that adjacent loops of a the first inductor coil 40 are separated from one another by a loop of the second inductor coil 50, and adjacent loops of the second inductor coil 50 are separated from one another by a loop of the first inductor coil 40. In an exemplary embodiment, each inductor coil 40 and 50 is copper, though other suitable conductive material may be used.

Together, the interleaved inductor coils 40 and 50 form an interleaved inductor coil 60. With the square rectangular layout shape of FIG. 2, the interleaved inductor coil 60 includes a first portion 61, a second portion 62 adjacent the first portion 61, a third portion 63 adjacent the second portion 62 and opposite the first portion 61, and a fourth portion 64 adjacent the third portion 63 and opposite the second portion 62.

The coupled inductor 26 further includes an isotropic magnetic core 70. The isotropic magnetic core 70 surrounds the interleaved inductor coil 60. Specifically, the isotropic magnetic core 70 is annular shaped and defines an opening 80 through which the interleaved inductor coil 60 passes. Further, the isotropic magnetic core 70 passes through the coil center 48.

Exemplary materials for the isotropic magnetic core 70 include, but are not limited to, CoZrTa, CoZrNb, CoZrTaN, CoFeHfO, CoPRe, CoPFeRe, NiFe, FeCo, CoZr, CoZrFe, CoZrTaB, CoZrB and/or mixtures thereof.

The isotropic magnetic core 70 of FIG. 2 is formed with four discrete core segments 71, 72, 73 and 74 that are separated from one another by gaps 81. Each core segment 71, 72, 73 and 74 surrounds only a portion of the interleaved inductor coil 60. As shown, the first isotropic magnetic core segment 71 surrounds the first portion 61 of the interleaved inductor coil 60, the second isotropic magnetic core segment 72 surrounds the second portion 62 of the interleaved inductor coil 60, the third isotropic magnetic core segment 73 surrounds the third portion 63 of the interleaved inductor coil 60, and the fourth isotropic magnetic core segment 74 surrounds the fourth portion 64 of the interleaved inductor coil 60. Each portion 61, 62, 63 or 64 of the interleaved inductor coil 60 is the part of the interleaved inductor coil 60 that is completely surrounded or enveloped by the relative core segment 71, 72, 73 and 74.

In the exemplary coupled inductor 26, the first inductor coil 40 and the second inductor coil 50 are configured to be inversely magnetically coupled to one another such that a first magnetic field induced by the first inductor coil 40 is opposite in polarity to a second magnetic field induced by the second inductor coil 50. Further, during operation, the first magnetic field induced by the first inductor coil 40 and the second magnetic field induced by the second inductor coil 50 form a single flux path.

In operation, inverse magnetic coupling is employed to avoid magnetic saturation. Specifically, whereas a high current in one inductor coil 40 or 50 may threaten to saturate magnetic core 70, saturation is avoided by passing a DC current through the other inductor coil 50 or 40 such that the induced magnetic field are counter in polarity to one another. During operation of the coupled inductor 26, the second magnetic field at least partially cancels the first magnetic field. This is a particularly valuable procedure in switched inductor power converters, as it affords very high current densities. Further, the saturation current may be less than 10 A, such as less than 5 A.

In an exemplary embodiment of operation, a first DC component of a first signal passing through the first inductor coil 40 is equal and opposite to a second DC component of a second signal passing through the second inductor coil 50. Effectively, this is akin to removing the DC offset of the signal allowing the AC to be affected by the inductance. In the exemplary embodiment, the second magnetic field completely cancels the first magnetic field. In another embodiment, the magnitude of the DC current in the inductor coil 50 is less than that of the inductor coil 40 but disposes the coupled inductor 26 just below saturation, thereby maximizing magnetic flux and inductance. This is analogous to biasing an amplifying transistor in its linear region. In yet another embodiment, negative feedback is provided through the inductor coil 50, thereby accurately controlling and manipulating any desired inductance—including linear.

Figure 3:
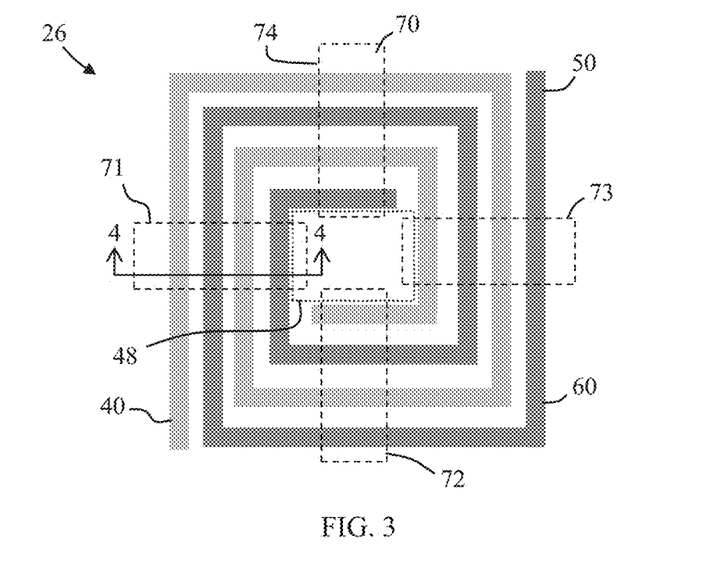
FIG. 3 is a top view of a rectangular coupled inductor, in accordance with an embodiment herein.
Figure 4:
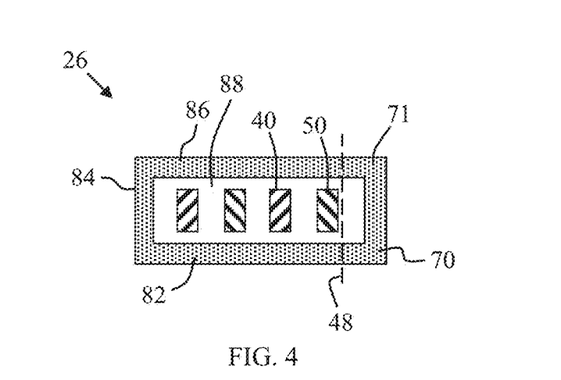
FIG. 4 is a cross sectional view of the coupled inductor of FIG. 3, taken along line 4-4 in FIG. 3.

FIGS. 3 and 4 provide a top view and cross sectional view, respectively, of a coupled inductor 26, with magnetic core segments 71, 72, 73 and 74. The coupled inductor 26 of FIGS. 3 and 4 includes one fewer turn or winding as compared to the coupled inductor of FIG. 2 and does not illustrate the first or second terminals of either inductor coil 40 or 50. In FIG. 3, the structural sameness of inductor coils 40 and 50 may be more clearly seen. As shown, each inductor coil 40 or 50 is offset or rotated 180 degrees from the other inductor coil 50 or 40, but is physically identical to the other inductor coil 50 or 40. As shown in FIG. 4, each winding of each inductor coil 40 and 50 is formed with a same height and same width. The height of each winding may be, but is not limited to, from about 5 μm to about 50 μm. The width of each winding may be, but is not limited to, from about 20 μm to about 200 μm.

Further, FIG. 4 illustrates more clearly that the magnetic core 70 includes a magnetic core bottom layer or yoke 82, magnetic core sidewalls or vias 84, and a magnetic core top layer or yoke 86. In the embodiment of FIG. 4, the vias 84 are directly connected to the bottom yoke 82 and to the top yoke 86. FIG. 4 further illustrates dielectric material 88 separating the inductor coils 40 and 50 from the magnetic core 70.

Figure 5:
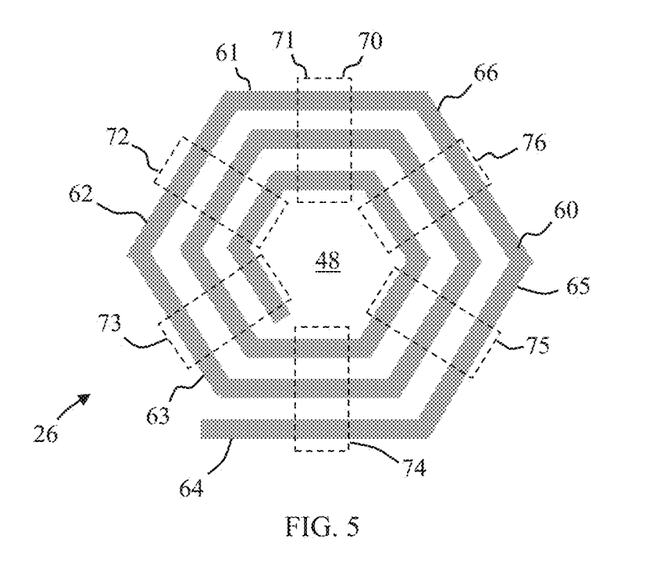
FIG. 5 is a top view of a hexagonal coupled inductor, in accordance with another embodiment herein.
Figure 6:
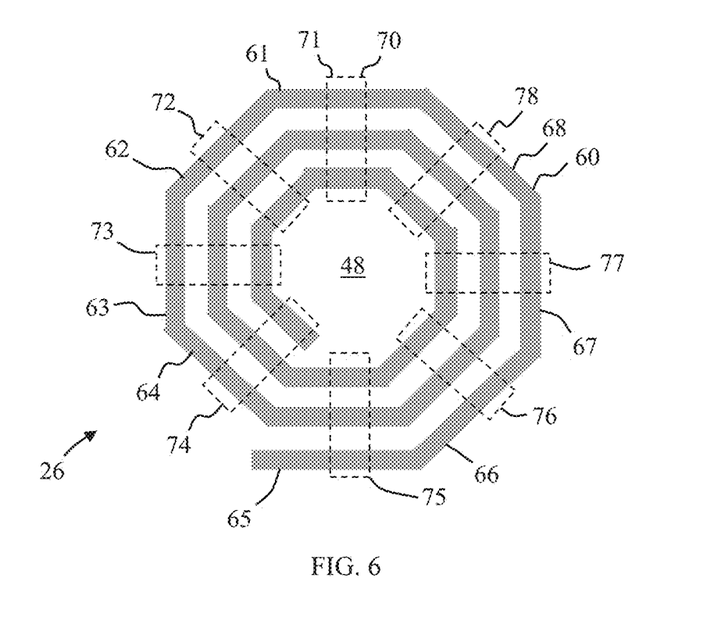
FIG. 6 is a top view of an octagonal coupled inductor, in accordance with a further embodiment herein.
Figure 7:
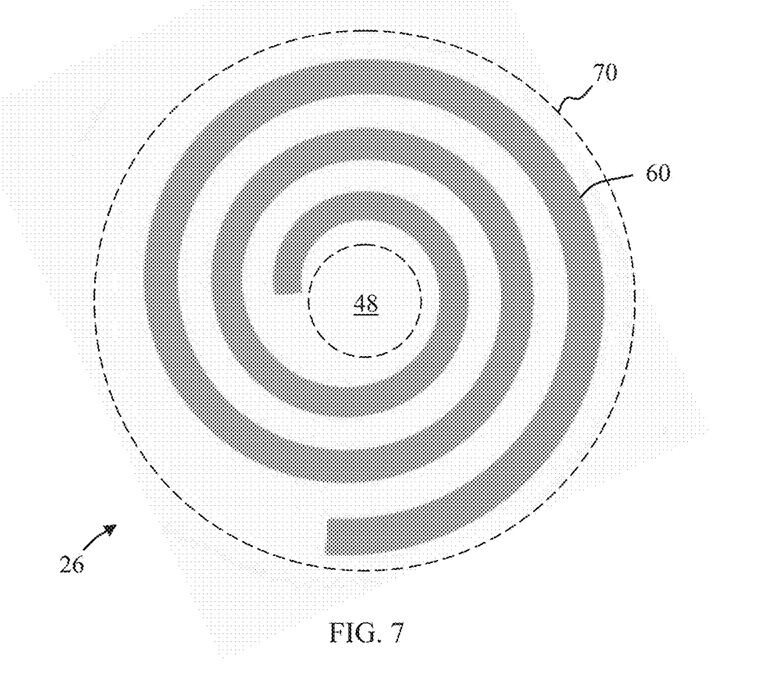
FIG. 7 is a top view of a circular coupled inductor, in accordance with another embodiment herein.

FIGS. 5-7 illustrate that coupled inductors 26 may have alternate geometric layouts. It is noted that FIGS. 5-7 generally show interleaved inductor coils 60 without individually illustrating the inductive coils 40 and 50 for purposes of simplicity and clarity. In FIG. 5, the coupled inductor 26 is formed with a hexagonal layout. Thus, the interleaved inductor coil 60 includes a first portion 61, a second portion 62 adjacent the first portion 61, a third portion 63 adjacent the second portion 62, a fourth portion 64 adjacent the third portion 63 and opposite the first portion 61, a fifth portion 65 adjacent the fourth portion 64 and opposite the second portion 62, and a sixth portion 66 adjacent the fifth portion 65 and opposite the third portion 63. Likewise, the magnetic core 70 includes a first isotropic magnetic core segment 71 surrounding the first portion 61 of the interleaved inductor coil 60, a second isotropic magnetic core segment 72 surrounding the second portion 62 of the interleaved inductor coil 60, a third isotropic magnetic core segment 73 surrounding the third portion 63 of the interleaved inductor coil 60, a fourth isotropic magnetic core segment 74 surrounding the fourth portion 64 of the interleaved inductor coil 60, a fifth isotropic magnetic core segment 75 surrounding the fifth portion 65 of the interleaved inductor coil 60, and a sixth isotropic magnetic core segment 76 surrounding the sixth portion 66 of the interleaved inductor coil 60.

In FIG. 6, the coupled inductor 26 is formed with an octagonal layout. Thus, the interleaved inductor coil 60 includes a first portion 61, a second portion 62 adjacent the first portion 61, a third portion 63 adjacent the second portion 62, a fourth portion 64 adjacent the third portion 63, a fifth portion 65 adjacent the fourth portion 64 and opposite the first portion 61, a sixth portion 66 adjacent the fifth portion 65 and opposite the second portion 62, a seventh portion 67 adjacent the sixth portion 66 and opposite the third portion 63, and an eighth portion 68 adjacent the seventh portion 67 and opposite the fourth portion 64. Likewise, the magnetic core 70 includes a first isotropic magnetic core segment 71 surrounding the first portion 61 of the interleaved inductor coil 60, a second isotropic magnetic core segment 72 surrounding the second portion 62 of the interleaved inductor coil 60, a third isotropic magnetic core segment 73 surrounding the third portion 63 of the interleaved inductor coil 60, a fourth isotropic magnetic core segment 74 surrounding the fourth portion 64 of the interleaved inductor coil 60, a fifth isotropic magnetic core segment 75 surrounding the fifth portion 65 of the interleaved inductor coil 60, a sixth isotropic magnetic core segment 76 surrounding the sixth portion 66 of the interleaved inductor coil 60, a seventh isotropic magnetic core segment 77 surrounding the seventh portion 67 of the interleaved inductor coil 60, and an eighth isotropic magnetic core segment 78 surrounding the eighth portion 68 of the interleaved inductor coil 60.

In FIG. 7, the coupled inductor 26 is formed with a circular or spiral layout. As shown, the isotropic magnetic core 70 does not include a plurality of discrete segments. Rather, the isotropic magnetic core 70 of FIG. 7 is a single unitary core that has a ring torus shape and surrounds the entire interleaved inductor coil 60.

Figure 8:
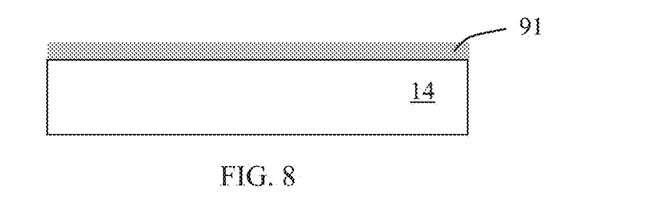
FIGS. 8-16 illustrate cross sectional views of processing of a portion of an integrated circuit for forming a coupled inductor with an isotropic magnetic core according to an embodiment herein.

FIGS. 8-16 illustrate cross sectional views of processing of a portion of an integrated circuit 10 for forming a coupled inductor with a two isotropic magnetic cores according to an embodiment herein. In FIG. 8, semiconductor substrate 14 is provided. A dielectric layer 91 is formed over the semiconductor substrate 14. An exemplary dielectric layer 91 is silicon oxide, though any suitable dielectric material may be used. In an exemplary embodiment, the dielectric layer 91 is formed by depositing dielectric material by chemical vapor deposition (CVD).

Figure 9:
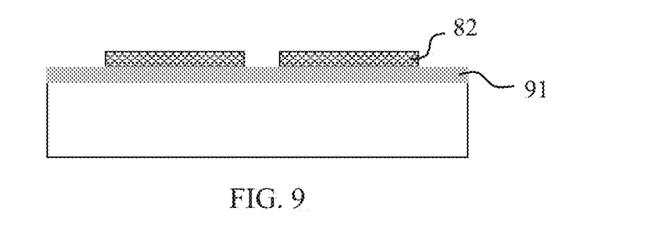

The method may continue in FIG. 9 with formation of the magnetic core bottom yokes 82. For example, magnetic core material may be deposited as a single layer or as a layer formed by a plurality of films. The magnetic core material may be deposited in the presence of a rotating magnetic field, a switching magnetic field, or no magnetic field. In some embodiments, a rotating or switching magnetic field may be used during deposition to cancel out unwanted ambient magnetic fields that may be present during the deposition. The magnetic core material has isotropic magnetic properties or attenuated anisotropic properties. The magnetic material can be, for example, CoZrTa, CoZrNb, CoZrTaN, CoFeHfO, CoPRe, CoPFeRe, NiFe, FeCo, CoZr, CoZrFe, CoZrTaB, CoZrB and/or mixtures thereof. These magnetic materials are deposited, for example, using electroplating or sputter deposition techniques commonly employed in the semiconductor processing industry, such as, for example DC magnetron sputter deposition. An adhesion layer of tantalum or titanium may be deposited over the dielectric layer 91 before the magnetic core material is deposited. The adhesion layer may facilitate adhesion of the magnetic core material to the dielectric layer 91. After deposition of the magnetic core material, the material is masked and etched using conventional lithography techniques to form the magnetic core bottom yokes 82. The thickness of bottom yoke may be, but is not limited to, from about 1 µm to about 5 µm.

Figure 10:
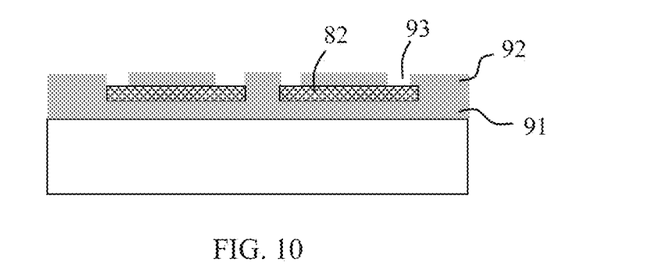

In FIG. 10, additional dielectric material 92 is deposited over the bottom yokes 82 and dielectric layer 91. Further, the dielectric material 92 is patterned and etched to form openings 93 over the magnetic core bottom yokes 82.

Figure 11:
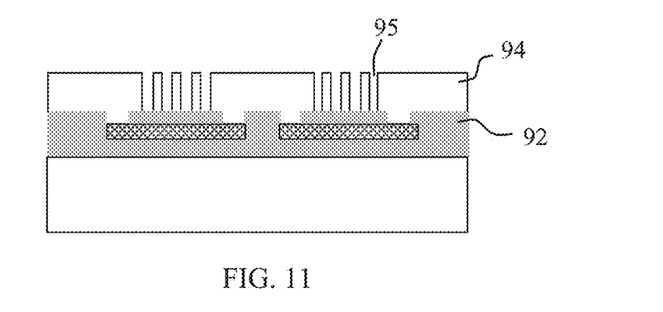

The method may continue in FIG. 11 with the formation of a mask 94 over the dielectric material 92. An exemplary mask 94 may be formed from photoresist. The mask 94 may be patterned by exposing, developing and removing portions of the photoresist to form trenches 95.

Figure 12:
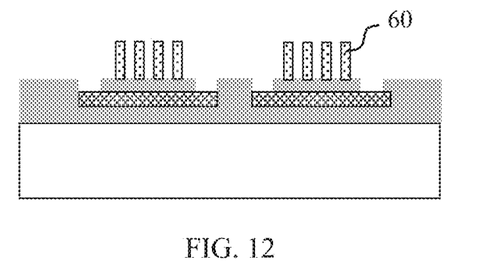

In FIG. 12, inductor coils are formed by depositing a conductive material in trenches 95. An exemplary conductive material is copper, though other suitable materials such as aluminum, tungsten or another metal may be used. In an exemplary embodiment, the conductive material is deposited into the trenches 95 and over the mask 94. A damascene plating process may be used to form the conductive material into coils through successive deposition and etching techniques. Thereafter, the mask 94 may be removed. As a result, interleaved inductor coils 60 are formed.

Figure 13:
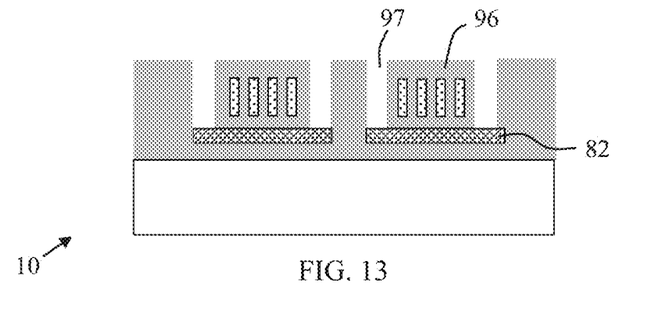

FIG. 13 illustrates the deposition of intercoil dielectric material 96. For example, silicon oxide or another suitable dielectric material may be deposited over the partially fabricated integrated circuit 10. Then, the dielectric material is patterned and etched to form trenches 97. As shown, trenches 97 are aligned with openings 93 of FIG. 10 and land on the magnetic core bottom yokes 82.

Figure 14:
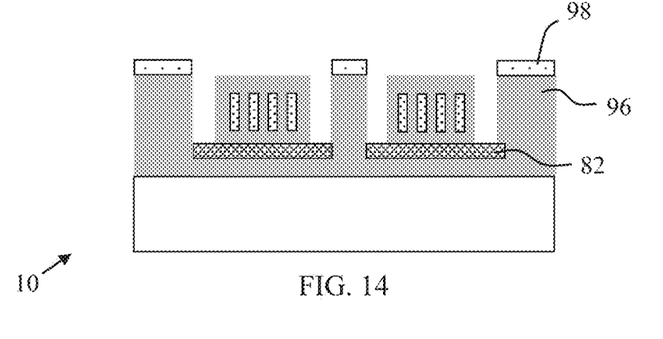

In FIG. 14, a mask 98 is formed over the partially fabricated integrated circuit 10. For example, a photoresist material may be coated onto the partially fabricated integrated circuit 10 and selectively developed and removed to cover the portions of the intercoil dielectric material 96 outside the footprint of the magnetic core bottom yokes 82 while exposing the magnetic core bottom yokes 82 and the portions of the intercoil dielectric material 96 overlying the magnetic core bottom yokes 82.

Figure 15:
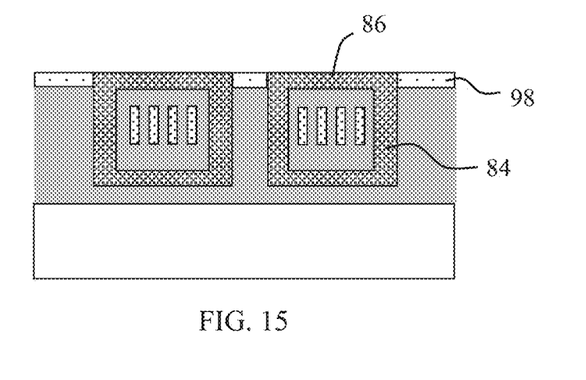

The method may continue in FIG. 15 with the formation of the magnetic core vias 84 and magnetic core top yokes 86. For example, magnetic core material may be deposited as described above in reference to FIG. 2 and employed in a damascene plating process to form the magnetic core vias 84 and magnetic core top yokes 86. In an exemplary embodiment, the magnetic core vias 84 are formed with a thickness of 50 µm or less, such as from about 1 µm to about 50 µm, for example from about 10 µm to about 50 µm or from about 1 µm to about 5 µm.

Figure 16:
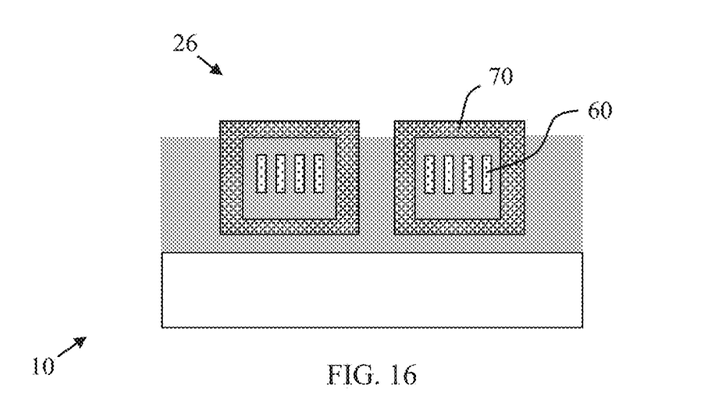

In FIG. 16, the mask 98 is removed, such as by a photoresist strip process. Terminals of the inductor coils (not shown) of the interleaved inductor coil 60 may be exposed for electrical connections. As a result, the integrated circuit 10 is formed with a coupled inductor 26 including an interleaved inductor coil 60 and an isotropic magnetic core 70 surrounding the interleaved inductor coil 60. Further processing may be performed to integrate the coupled inductor 26 with the integrated circuit device 34 of FIG. 1 and/or other components.

The process described in FIGS. 8-16 enables the formation of a magnetic core 70 completely surrounding each portion of the interleaved inductor coil 60 of the coupled inductor 26. Such a structure provides for improved inductance density. The use of isotropic magnetic material as described herein allows for the location of the magnetic core on all sides of the interleaved inductor coil 60 of the coupled inductor 26, as the isotropic magnetic material provides magnetization and similar magnetic properties in any direction. Further, the process described may be integrated into existing process flows with little cost.

As described herein, coupled inductors, such as for use in voltage regulators, are provided. Exemplary coupled inductors include isotropic magnetic cores and interleaved inductor coils. As described, the exemplary coupled inductors achieve high inductance, large current capability, small DC resistance, and small chip area.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating an integrated circuit, the method comprising:
   providing a semiconductor substrate;
   forming an isotropic magnetic core bottom yoke over the semiconductor substrate;
   forming an inductor coil over the isotropic magnetic core bottom yoke;
   forming isotropic magnetic core sidewalls over the isotropic magnetic core bottom yoke and around the inductor coil; and
   forming an isotropic magnetic core top yoke over the isotropic magnetic core sidewalls and over the inductor coil.

2. The method of claim 1 wherein:
   forming the isotropic magnetic core sidewalls over the isotropic magnetic core bottom yoke comprises forming the isotropic magnetic core sidewalls directly on the isotropic magnetic core bottom yoke; and
   forming the isotropic magnetic core top yoke over the isotropic magnetic core sidewalls comprises forming the isotropic magnetic core top yoke directly on the isotropic magnetic core sidewalls.

3. The method of claim 1 wherein forming the inductor coil over the isotropic magnetic core bottom yoke comprises forming the inductor coil arranged around a coil center surrounding a coil axis.

4. The method of claim 1 wherein forming the inductor coil over the isotropic magnetic core bottom yoke comprises forming a first inductor coil and forming a second inductor coil interleaved with the first inductor coil to define an interleaved inductor coil.

5. The method of claim 4 wherein forming the inductor coil over the isotropic magnetic core bottom yoke comprises forming the interleaved inductor coil arranged around a coil center surrounding a coil axis.

6. The method of claim 5 wherein the interleaved inductor coil defines a top side and a bottom side, and wherein the top side and the bottom side are perpendicular to the coil axis.

7. The method of claim 6 wherein the isotropic magnetic core bottom yoke and the isotropic magnetic core top yoke surround a portion of the interleaved inductor coil and pass through the coil center from the bottom side to the top side of the interleaved inductor coil.

8. The method of claim 4 wherein the first inductor coil and the second inductor coil are structurally identical.

9. The method of claim 4 wherein the first inductor coil and the second inductor coil are configured to be inversely magnetically coupled to one another such that a first magnetic field induced by the first inductor coil is opposite in polarity to a second magnetic field induced by the second inductor coil, wherein the second magnetic field at least partially cancels the first magnetic field.

10. The method of claim 9 wherein a first magnetic field induced by the first inductor coil and a second magnetic field induced by the second inductor coil form a single flux path.

11. The method of claim 1 wherein the isotropic magnetic core bottom yoke and the isotropic magnetic core top yoke are formed from CoZrTa, CoZrNb, CoZrTaN, CoFeHfO, CoPRe, CoPFeRe, NiFe, FeCo, CoZr, CoZrFe, CoZrTaB, CoZrB and/or mixtures thereof.

12. The method of claim 1 wherein the isotropic magnetic core bottom yoke and the isotropic magnetic core top yoke surround all of the inductor coil.

13. The method of claim 1 wherein the isotropic magnetic core bottom yoke and the isotropic magnetic core top yoke have a ring torus shape and surround all of the interleaved inductor coil.

14. The method of claim 1 wherein the inductor coil forms a voltage regulator, and wherein the method further comprises:
   physically coupling an interposer to the semiconductor substrate; and
   physically coupling an integrated circuit device to the interposer, wherein the voltage regulator is operable for regulating an operating voltage of the integrated circuit device.

15. The method of claim 14 wherein the isotropic magnetic core bottom yoke and the isotropic magnetic core top yoke are formed from CoZrTa, CoZrNb, CoZrTaN, CoFeHfO, CoPRe, CoPFeRe, NiFe, FeCo, CoZr, CoZrFe, CoZrTaB, CoZrB and/or mixtures thereof.

16. The method of claim 14 wherein the isotropic magnetic core bottom yoke and the isotropic magnetic core top yoke surround all of the inductor coil.

17. The method of claim 14 wherein forming the inductor coil over the isotropic magnetic core bottom yoke comprises forming a first inductor coil and forming a second inductor coil interleaved with the first inductor coil to define an interleaved inductor coil.

18. The method of claim 17 wherein:
   the interleaved inductor coil includes a first portion, a second portion adjacent the first portion, a third portion adjacent the second portion and opposite the first portion, and a fourth portion adjacent the third portion and opposite the second portion; and
   the isotropic magnetic core bottom yoke, the isotropic magnetic core sidewalls, and the isotropic magnetic core top yoke form an isotropic magnetic yoke including:
   a first isotropic magnetic yoke segment surrounding the first portion of the interleaved inductor coil; and
   a second isotropic magnetic yoke segment surrounding the second portion of the interleaved inductor coil;
   a third isotropic magnetic yoke segment surrounding the third portion of the interleaved inductor coil; and
   a fourth isotropic magnetic yoke segment surrounding the fourth portion of the interleaved inductor coil, wherein the first isotropic magnetic yoke segment, second isotropic magnetic yoke segment, third isotropic magnetic yoke segment, and fourth isotropic magnetic yoke segment are discrete.

19. The method of claim 17 wherein the isotropic magnetic core bottom yoke, the isotropic magnetic core sidewalls, and the isotropic magnetic core top yoke form an isotropic magnetic yoke, and wherein the isotropic magnetic yoke includes isotropic magnetic yoke segments separated from one another by gaps.

20. A method for fabricating an integrated circuit, the method comprising:
   providing a semiconductor substrate;
   forming a voltage regulator in an interposer, wherein the voltage regulator includes a coupled inductor comprising:
   an interleaved inductor coil arranged around a coil center; and
   an isotropic magnetic core surrounding a portion of the interleaved inductor coil and passing through the coil center, wherein the interposer is physically coupled to the semiconductor substrate; and physically coupling an integrated circuit device to the interposer, wherein the voltage regulator is operable for regulating an operating voltage of the integrated circuit device.

\* \* \* \* \*